United States Patent
Flamand et al.

(10) Patent No.: US 7,960,246 B2
(45) Date of Patent: Jun. 14, 2011

(54) METHOD FOR THE MANUFACTURE OF ELECTRONIC DEVICES ON SUBSTRATES AND DEVICES RELATED THERETO

(75) Inventors: Giovanni Flamand, Oelegem (BE); Wim Geens, Mechelen (BE); Jef Poortmans, Kessel-Lo (BE)

(73) Assignees: IMEC, Leuven (BE); UMICORE, Brussels (BE)

( * ) Notice: Subject to any disclaimer, the term of this patent is extended or adjusted under 35 U.S.C. 154(b) by 1450 days.

(21) Appl. No.: 11/146,874

(22) Filed: Jun. 6, 2005

(65) Prior Publication Data

US 2005/0272222 A1 Dec. 8, 2005

Related U.S. Application Data

(60) Provisional application No. 60/577,162, filed on Jun. 4, 2004.

(30) Foreign Application Priority Data

Jun. 8, 2004 (EP) .................... 04447140

(51) Int. Cl.
H01L 21/30 (2006.01)
H01L 21/46 (2006.01)

(52) U.S. Cl. ............... 438/458; 257/E21.567

(58) Field of Classification Search .......... 438/458; 257/E21.567
See application file for complete search history.

(56) References Cited

U.S. PATENT DOCUMENTS

| | | | |
|---|---|---|---|
| 5,034,343 A * | 7/1991 | Rouse et al. | 438/400 |
| 5,661,333 A | 8/1997 | Biasse et al. | 257/618 |
| 5,851,845 A * | 12/1998 | Wood et al. | 438/15 |
| 6,127,243 A | 10/2000 | Werner et al. | 438/456 |
| 6,388,313 B1 * | 5/2002 | Lee et al. | 257/686 |
| 6,483,174 B1 * | 11/2002 | Crafts et al. | 257/662 |
| 6,555,443 B1 | 4/2003 | Artmann et al. | 438/458 |
| 7,223,635 B1 * | 5/2007 | Brewer | 438/109 |
| 2001/0054480 A1 | 12/2001 | Gerss et al. | 156/280 |
| 2002/0190269 A1 | 12/2002 | Atwater, Jr. et al. | 257/184 |
| 2003/0032294 A1 | 2/2003 | Gardes | 438/694 |
| 2003/0219959 A1 * | 11/2003 | Ghyselen et al. | 438/458 |
| 2004/0058511 A1 * | 3/2004 | Sakaguchi | 438/458 |

FOREIGN PATENT DOCUMENTS

DE 10156465 C1 7/2003

OTHER PUBLICATIONS

Published European Search Report for application of Interuniversitair Microelektronica Centrum vzw, No. EP 01 44 7140, dated Dec. 8, 2004.
"Qualification Testing", National Aeronautics and Space Administration (NASA) Specification NASA SP-8044, May 1970, 30 pages.
"Procedure for Qualifications", European Space Agency (ESA) Specification ESSC 12100, Issue 2, Jul. 2003, pp. 1-24.

* cited by examiner

Primary Examiner — Jarrett J Stark
(74) Attorney, Agent, or Firm — McDonnell Boehnen Hulbert & Berghoff LLP

(57) ABSTRACT

Methods for manufacturing electronic devices and devices produced by those methods are disclosed. One such method includes releasably bonding a first surface of a device substrate to a face of a first carrier substrate using a first bonding agent to produce a first composite substrate, where the face of the first carrier substrate includes a pattern of trenches. The method also includes processing the device substrate to manufacture an electronic device on a second surface of the device substrate. The method further includes releasing the device substrate from the first carrier substrate by a releasing agent.

15 Claims, 5 Drawing Sheets

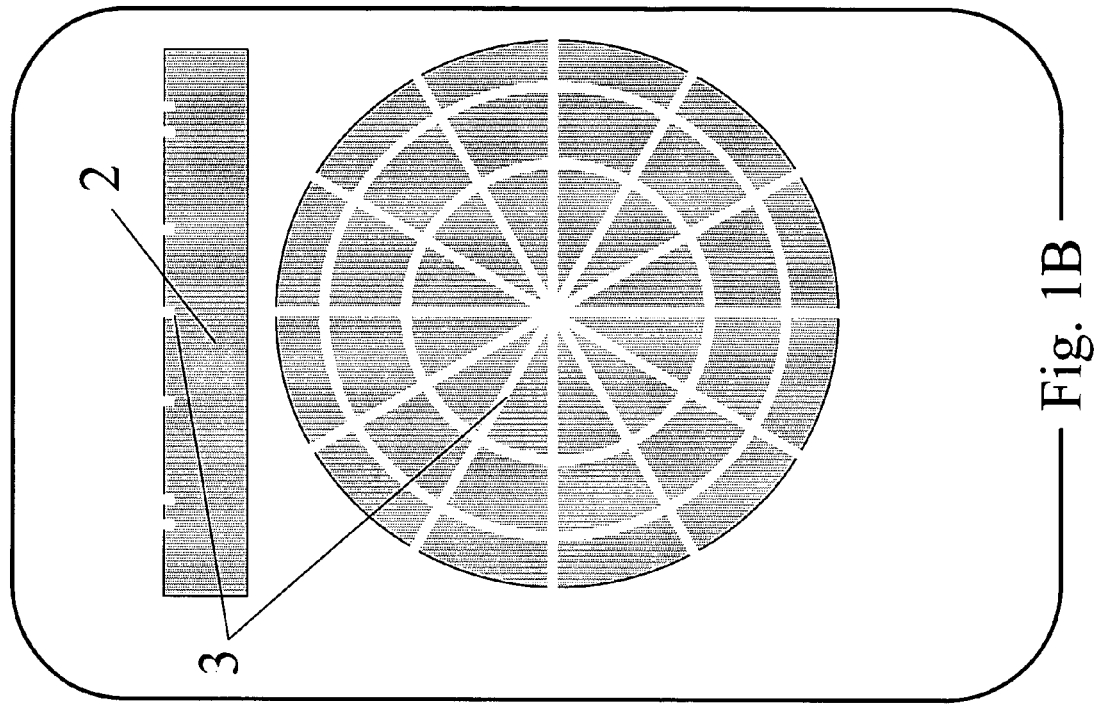
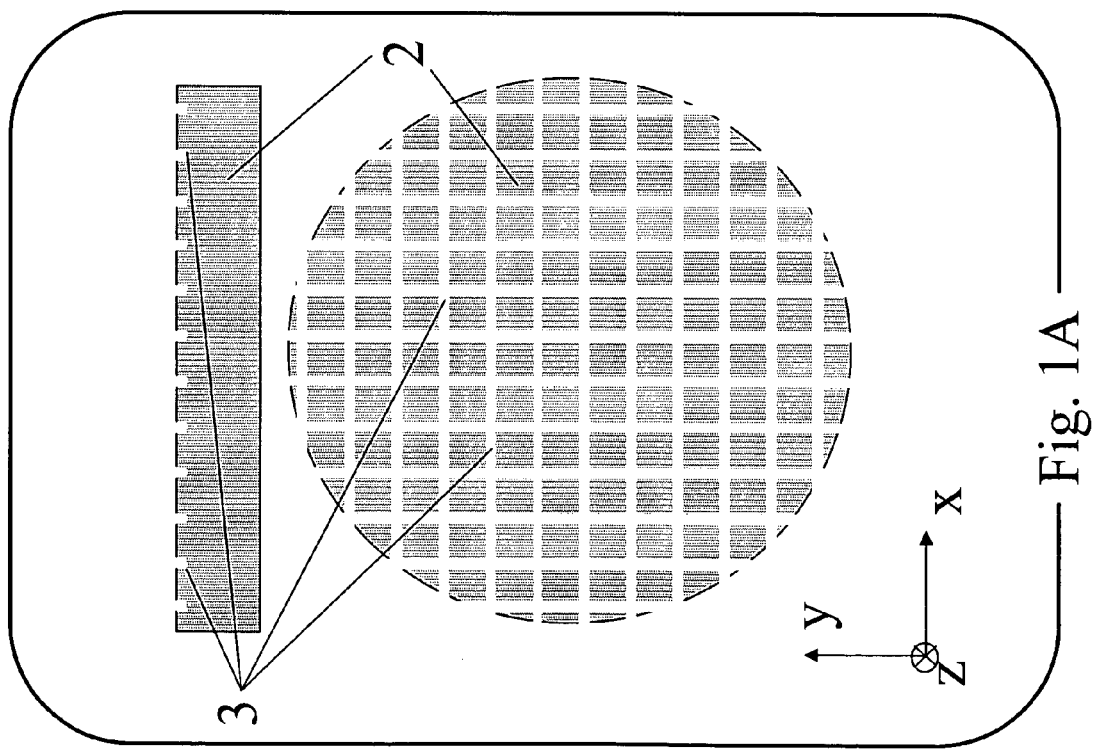

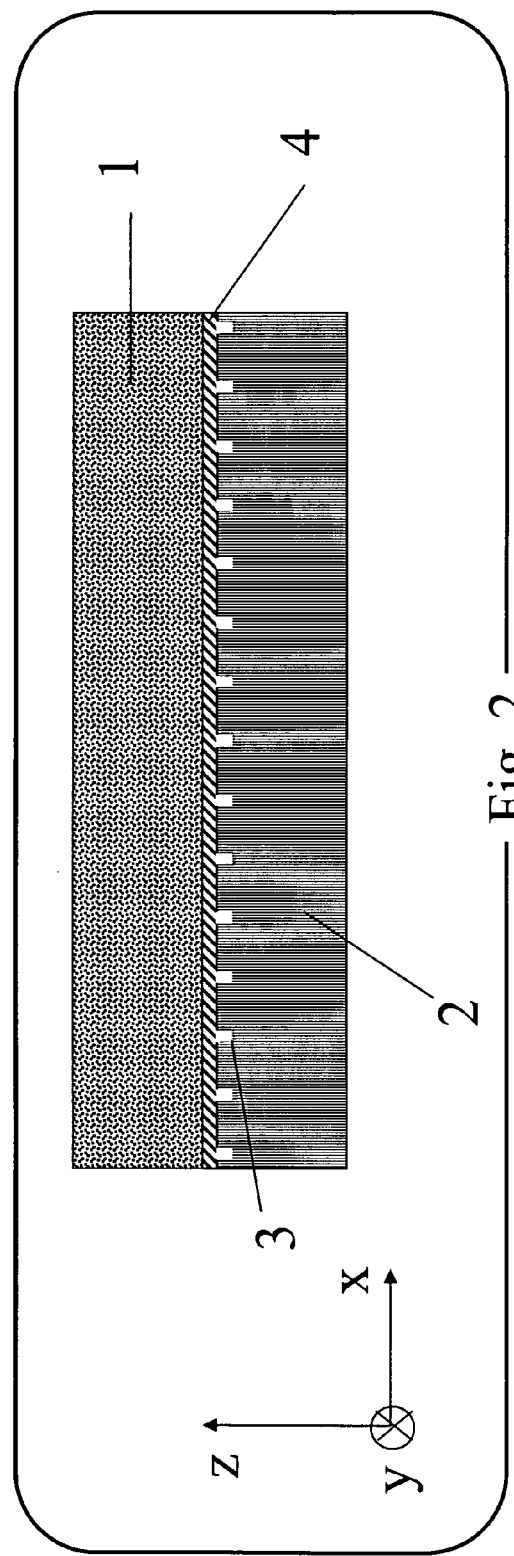
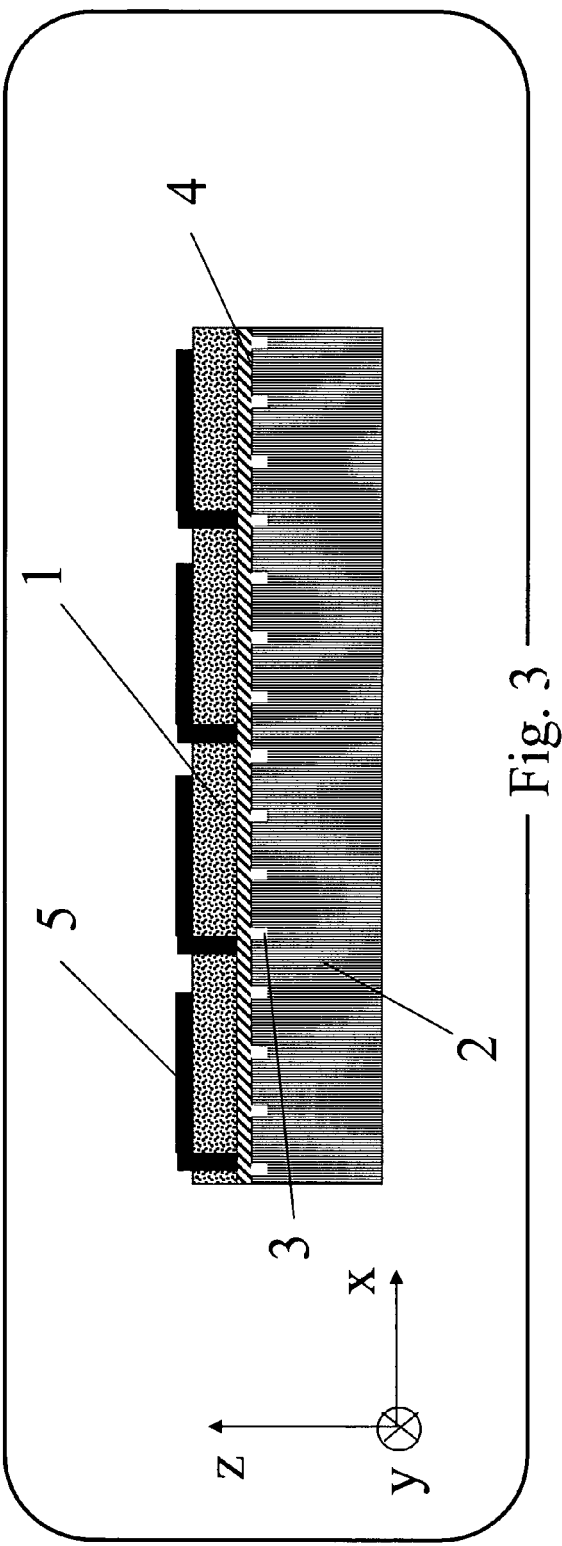
Fig. 2
Fig. 3

METHOD FOR THE MANUFACTURE OF ELECTRONIC DEVICES ON SUBSTRATES AND DEVICES RELATED THERETO

CROSS REFERENCE TO RELATED APPLICATIONS

This application claims priority benefit under 35 U.S.C. §119(e) to U.S. Provisional Patent Application Ser. No. 60/577,162, filed on Jun. 4, 2004. This application also claims foreign priority benefit under 35 U.S.C. §119(a) to European Patent Application EP 04447140.7, filed on Jun. 8, 2004. The disclosures of U.S. Provisional Patent Application Ser. No. 60/577,162 and European Patent Application EP 04447140.7 are incorporated by reference herein in their entirety.

BACKGROUND

1. Field

This disclosure relates to electronic devices and, more particularly, to methods for manufacturing electronic devices on substrates and devices produced by those methods.

2. Description of Related Art

Solar cell arrays are often used in space exploration application to provide a source of power for equipment used in such applications. As the exploration of space continues to advance, the power production requirements for solar arrays used in space applications continues to increase. As part of this increase in power production requirements, a corresponding increase in operating voltage is also desirable. However, increasing operating voltage for current solar arrays could result in a significant increase in the mass of such arrays. Such an increase in mass is inconsistent with a general desire to reduce the overall mass of spacecraft.

Furthermore, increasing a solar cell array's operating voltage also increases the likelihood of degradation of the solar cell array due to arcing that may occur as a result of plasma-prone environments, especially those that exist in spacecraft environments. Thus, solar arrays with higher operating voltages that have reduced arcing propensity (and methods for producing such solar arrays), without significantly increasing the overall mass are desirable.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with devices and methods which are given by way of example and meant to be illustrative, not limiting in scope. In various embodiments, one or more of the above-described problems have been reduced or eliminated, while other embodiments are directed to other improvements.

Example methods for manufacturing electronic devices that may be used to produce devices using relatively thin substrates (e.g., as compared with existing solar cells used in space applications) and example device produced by such methods are described herein. One such method includes releasably bonding a device substrate to a face of a first carrier substrate using a first bonding agent (e.g., spin-on-glass) to produce a first composite substrate. The method then includes processing the device on the device substrate to manufacture an electronic device disposed on its surface. Processing the device substrate may include thinning the device substrate (e.g., by grinding or using chemical-mechanical polishing). The method further includes releasing the device substrate from the first carrier substrate using a releasing agent. The first carrier substrate may include one or more trenches that are disposed on its surface, where the trenches provide for distributing the release agent between the device substrate and the carrier substrate.

In another example embodiment, the device substrate, after processing the device substrate to produce the electronic device, is bonded to a second carrier substrate using a second bonding agent to produce a second composite substrate. In this method, the second composite substrate is produced prior to releasing the device substrate from the first carrier substrate.

BRIEF DESCRIPTION OF THE DRAWINGS

Example embodiments are illustrated in referenced figures of the drawings. It is intended that the embodiments and figures disclosed herein are to be considered illustrative rather than restrictive. In the figures, analogous elements are referenced with like reference numbers.

FIGS. 1A and 1B are drawings illustrating two carrier substrates including patterns of trenches disposed on their surfaces in corresponding plan and cross-sectional views;

FIG. 2 is a cross-sectional drawing that illustrates a composite substrate including a device substrate that is bonded to a first carrier substrate, such as the carrier substrate of FIG. 1A or FIG. 2A, with a first bonding agent;

FIG. 3 is a cross-sectional drawing that illustrates a composite substrate, such as the composite substrate of FIG. 2, where the device substrate has been thinned and has electrical interconnects formed through through-holes in the device substrate;

DETAILED DESCRIPTION

Figure 4:
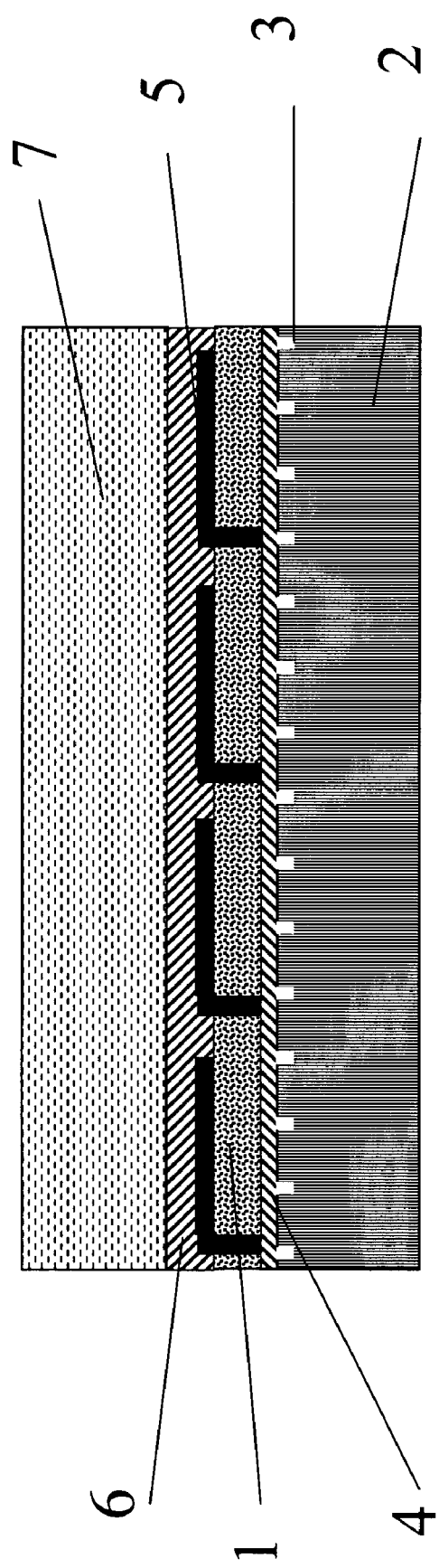
FIG. 4 is a cross-sectional drawing of a second composite substrate, where the composite substrate of FIG. 3 is bonded with a second carrier substrate using a second bonding agent.

Embodiments of electronic devices and methods for manufacturing such devices are generally described herein in the context of solar cells for use in space applications. However, it will be appreciated that these embodiments are illustrative and not limiting. Such techniques may be implemented for any number of different types of electronic devices, such as CMOS circuits, SiGe devices, or any number of other electronic devices that are manufactured using a substrate material.

Overview

As described above, solar cell panels (and processes for manufacturing such cells) that allow for reduced mass and reduction of arcing, especially in plasma-prone environments such as encountered in space applications, are desirable. One approach that would reduce the risk of arcing would be to reduce the overall number of electrical connections that are exposed to the ambient environment. This may be accomplished by covering the solar cell panels (and thus the electrical connections between individual cells) with a glass plate. Such an approach would provide for forming integrated high voltage modules (HVM) that would allow for the desired increased voltage potential described above while preventing degradation of the solar cells due to arcing. This approach, however, would not address the desire to reduce (or at least not significantly increase) the mass of such solar cell panels.

To address the desire to either reduce, or not significantly increase, the weight of solar panels in order to increase the amount of power and/or voltage they produce, one possible solution that could be used is to reduce the thickness of the substrate on which the solar cells are produced. While solar cells produced using thinned substrates may suffer from mechanical stability concerns, the glass cover described above could be used to provide structural stability (e.g., act as a superstrate) for such solar cell arrays. Therefore, using a combination of thinned substrates in combination with glass superstrates, solar cell arrays with increased power production and/or voltage potential, as well as reduced overall mass could be produced.

As a point of reference, in the context of existing III-V multi-junction solar cell technology on germanium, active photovoltaic layers represent only a few microns of material thickness grown on the surface of a germanium substrate. Such substrates are typically around 140 µm thick. Accordingly, the successful implementation of high voltage, integrated multi-junction solar cell modules on thin germanium based substrates could produce considerable cost benefits as well as the desired mass reduction. However, thinning such substrates sufficiently and handling the resulting substrates during manufacturing without creating damage or destroying such thin substrates is not a trivial matter.

First Carrier Substrate

Referring to FIGS. 1A and 1B, two examples of first carrier substrates that may be used for manufacturing electronic devices (e.g., solar cell arrays) according to the methods disclosed herein are illustrated. In one such method, a device substrate is releasably bonded to a face of a first carrier substrate using a first bonding agent to produce a first composite substrate. The device substrate is then processed to produce one or more electronic devices on its surface. Such processing may include thinning the substrate. After processing of the electronic device, the device substrate is released from the first carrier substrate using a releasing agent.

Referring to FIG. 1A, a first carrier substrate 2 is shown. The first carrier substrate 2 of FIG. 1A is a circular disc that has trenches 3 disposed on its surface in a lattice pattern with grid lines in the x and y directions, as indicated in FIG. 1A. The x and y axis are orthogonally positioned with respect to each other and in plane with the surface of the carrier substrate 2. It will be appreciated, that for semiconductor materials, the lattice constants in the x and y directions for the carrier substrate 2 are not necessarily equal. As an alternative, varying the grid line distances for the trenches 3 is also possible, as is using a random pattern for the trenches 3.

For electronic devices manufactured using the carrier substrate 2 of FIG. 1, a device substrate on which the electronic devices are formed may take the form of the same or different materials than the carrier substrate 2. Some examples that may be used for the carrier substrate 2 are germanium, silicon, GaAs, and alumina. Also, the carrier substrate 2 may be of different shapes and is not limited to taking the form of a circular disk.

As may be seen in the cross-sectional view in FIG. 1A, the trenches 3 in the carrier substrate 2 are formed in an upper surface of the carrier substrate 2. The upper surface of the carrier substrate 2 is substantially planar, which is desirable for bonding the carrier substrate 2 to a device substrate. The sidewalls of the trenches 3 are shown as perpendicular, however, other configurations are possible, such as sloped sidewalls, for example. The trenches 3 may be formed in the surface of the carrier substrate 2 using any number of techniques, such as dry etching or wet etching, for example.

When forming a composite substrate with a device substrate, it may be advantageous to have the carrier substrate 2 and the device substrate define substantially the same geometric shape with substantially the same geometric area such that the two substrates are easily aligned to one another.

FIG. 1B illustrates an alternative carrier substrate 2 with trenches 3 that includes a number of concentric circular trenches and a series of angularly equally spaced trenches that extend radially from the geometric center of the carrier substrate 2 in FIG. 1B. As with the pattern of trenches 3 shown in FIG. 1A, the pattern of trenches 3 illustrated in FIG. 1B is illustrative and any number of regular or random patterns may be used when forming the trenches 3.

The trenches 3 and their pattern, when used in conjunction with methods for producing electronic devices described herein, affect bonding of a device substrate to the carrier substrate 2 and, subsequently, releasing the device substrate from the carrier substrate 2. Furthermore, the shape of the trenches 3, their pattern, depth, and other characteristics may affect the mechanical stability of composite substrates formed by bonding a device substrate with the corresponding carrier substrate 2. The characteristics of the trenches 3 may take on even more importance when the device substrate is subjected to a thinning step. In order to reduce the occurrence of any adverse effects from the trenches 3 in such situations, the trenches 3 may be formed such that their width is limited. For example, the width of the trenches 3 may be limited to 50 µm, 40 µm, 30 µm or 20 µm, such that the occurrence of any structural stability problems is reduced, e.g., while thinning the device substrate. Depending on the specific application, it may also be desirable that the trench depth be greater than 5 µm or greater than 10 µm.

For methods that include thinning of the device substrate, it is desirable that the carrier substrate 2 does not include any through holes in place of the trenches 3 (e.g., for introducing a releasing agent), as such through holes may result in damage to the device substrate during the thinning process. Such damage may more frequently occur for relatively weak device substrates, such as Ge wafers, which are known to have less mechanical strength than silicon wafers.

Such damage may occur during a thinning process that includes a grinding step. During the grinding step, the composite substrate may be held by applying a vacuum on the non bonded surface of the first carrier substrate and a pressure being applied on the non bonded surface of the device substrate. The vacuum induces a force on the device substrate, which may cause the device substrate (or sections of the device substrate) to be pulled/pushed into such through holes. This risk increases for larger diameter through holes. This situation may result in cracks or in dimples (spots with less material removed) on the thinned surface.

Forming First Composite Substrate

FIG. 2 is a cross-sectional drawing that illustrates a device substrate 1 that is releasably bonded with a first carrier substrate 2 (such as the carrier substrates illustrated in FIGS. 1A and 1B) using a first bonding agent 4 to produce a first composite substrate. A number of factors should be considered when implementing a process for releasably bonding the device substrate 1 to the carrier substrate 2. The factors include the selection of the first bonding agent 4; and selection of the materials for the device substrate 1 and the carrier substrate 2. Another factor that should be considered is whether surface treatment of the carrier substrate 2 and/or the device substrate 1 is appropriate to approve adhesion of the first bonding agent 4 with the surfaces of the device substrate 1 and the carrier substrate 2 that are bonded to form the composite substrate shown in FIG. 2.

Another factor to be considered for the process of releasably bonding the device substrate 1 with the carrier substrate 2 is the process of applying the bonding agent 4. For instance, the bonding agent 4 should be applied such that its application facilitates releasing the device substrate 1 from the carrier substrate 2, such as by using a releasing agent. Furthermore, the bonding agent 4 should adhere sufficiently well to both the device substrate 1 and the first carrier substrate 2 to facilitate a strong bond that is able to withstand processing, including thinning of the device substrate 1. For example, it is important that the process of applying the bonding agent 4 does not fill (or substantially fill) the trenches 3 in the carrier substrate 2. Were the bonding agent 4 to fill the trenches 3, the flow of a releasing agent in the trenches 3 to facilitate release of the device substrate 1 from the carrier substrate 2 would be impeded.

The bonding agent 4 may be applied on either one or both of (i) a face of the device substrate 1 and (ii) the face of the carrier substrate 2 on which the trenches 3 are formed, where the trenches are not filled with the bonding agent 4, so as to not prevent the flow of a releasing agent (e.g., liquid or gas). In empirical studies, it has been shown that applying a bonding agent on both a face of the device substrate and the face comprising trenches of the first carrier substrate may result in better performance. In general, for certain embodiments, it is preferred that the sidewalls and the floors of the trenches 3 remain substantially free of the bonding agent 4 in order to provide for efficient flow of a releasing agent through the trenches 2.

A further factor to consider for the process of releasably bonding the device substrate 1 to the carrier substrate 2 using the bonding agent 4 is the thermal expansion coefficients (TECs) of each material. Depending on the particular application, it may be preferable that the TECs of the device substrate 1, the carrier substrate 2 and the bonding agent 4 be closely matched or compatible.

In one embodiment, the bonding agent 4 is spin-on glass (SOG). It will be appreciated that certain spin-on glasses can be used when working with a germanium substrate and a germanium carrier substrate, as it is possible to closely match the TEC of spin-on glass with the TEC of germanium. Some examples of spin-on glasses that have TECs that are closely matched with the TEC of germanium (which is $6.10^{-6}$ $K^{-1}$) are Accuglass 311®, Accuglass 512B® (which are available from Honeywell) and spin-on glasses 200F and 550F (which are available from Filmtronics). These example SOGs all have TECs of approximately $5.10^{-6}$ $K^{-1}$. In general, (e.g., for embodiments that have thermal processing steps), the TEC of the bonding agent 4 should not differ more than 50% from the TECs of the carrier substrate 2 and device substrate 1. In other embodiments, it may be desirable that the TEC of the bonding agent 4 not differ more than 20% from the TECs of the carrier substrate 2 and device substrate 1. It will be appreciated that other combinations of materials for the device substrate 1, the carrier substrate 2 and the bonding agent 4 may be used, such as, respectively, (i) silicon, silicon and a spin-on glass with a compatible TEC; or (ii) GaAs, silicon and a spin-on glass with a compatible TEC. In each of these material combinations, hydrofluoric acid may be used as a releasing agent.

In an example process for producing a composite substrate, such as the composite substrate illustrated in FIG. 2, a germanium device substrate 1 is bonded to a carrier substrate 2 by applying a bonding agent 4 to a face of the device substrate 1 and, alternatively, also applying the bonding agent 4 to a surface of the carrier substrate 2 on which a pattern of trenches 3 has been formed.

The device substrate 1 and the carrier substrate 2 are then pressed together where the bonding agent 4 covered surface(s) are in between the two substrates. In any event, the device substrate 1 and the carrier substrate 2 are positioned such that the bonded face of the carrier substrate 2 is the trench-patterned face. Care is taken that the bonding agent 4 does not fill the trenches 3 in the carrier substrate 2.

As was discussed above, the bonding agent in this example is a SOG with a TEC that is closely matched to the TEC of the device substrate 1 and the carrier substrate 2. The SOG is deposited on the face of the device substrate 1 and/or on the trench patterned face of the carrier substrate 2. An appropriate amount of the SOG is substantially evenly distributed over the surface of the device substrate 1 and/or the carrier substrate 2 by spinning the substrate(s). For example, spinning may be performed between 1000 and 5000 rpm, for a duration of 10 to 120 seconds. Alternatively, spinning may be performed at 2000 rpm for 30 seconds.

In this example embodiment, the bonding agent 4 (SOG) is then cured using a cure-bake step at a temperature between 300° C. and 600° C., for a duration of 10 to 120 minutes. In certain embodiments, the curing temperature is between 400° C. and 450° C., and the cure-bake duration is approximately 60 minutes. Curing of the bonding agent 4 may be performed in a nitrogen environment. However, it will be appreciated that other curing environments are possible, such as, for instance, air, a forming gas or hydrogen.

Processing Device Substrate

The device substrate 1 of the composite substrate illustrated in FIG. 2 may then undergo processing to form one or more electronic devices on the surface of the device substrate. The processing of the device substrate 1 may include thinning the device substrate 1. The device substrate 1 in FIG. 3 is shown after thinning from the thickness illustrated for the device substrate 1 in FIG. 2. This thinning step may be performed by grinding or, alternatively, by Chemical Mechanical Polishing (CMP). A commonality between these approaches is that they apply a mechanical force on the device substrate 1 and the carrier substrate 2. This force can severely affect the mechanical integrity of the substrates. If care is not taken in the selection of materials and the process of bonding the device substrate 1 with the carrier substrate 2, the device substrate 1 may be damaged or destroyed as a result of the thinning step. Therefore, the bonding agent 4 should (along with the carrier substrate) provide both mechanical stability and support to the device substrate 1 to allow it to be successful thinned. Alternatively, the device substrate 1 may be thinned by dry etching, wet etching, or a combination of such techniques such as those described herein or any other appropriate methods.

For methods including such a thinning process, the device substrate 1 may have a thickness of greater than 50 µm before the thinning process and less than 50 µm after thinning. In other instances, thicker substrates (e.g., with a thickness of greater than 90 µm) may be thinned to less than 80 µm, less than 70 µm, less than 60 µm, or less than 50 µm. In still other embodiments, such as embodiments that result in reduced mass, substrates of virtually any appropriate thickness may be thinned to less than 40 µm, less than 35 µm, less than 30 µm, less than 25 µm, less than 20 µm, less than 15 µm, less than 10 µm, or less than 5 µm. It will be appreciated that current commercial device substrates (e.g., solar cell device substrates) typically have a thickness of 90 μm or more.

As was previously described, the thinning of the device substrate 1 may be industrially or commercially desirable, with the attendant advantages discussed above. Furthermore, thinning of the device substrate 1 may result in other advantages when used for producing a device that is to have through holes and/or separation channels formed in the device substrate 1. For purposes of this disclosure, a through hole is defined as a hole that connects the front side of a substrate (e.g., the device substrate 1) to the back side of that substrate. A cross-section of such a through hole in a longitudinal direction may have any shape and can vary depending on its position (depth) in the hole. Typically, such a cross-section is circular or elliptic. However, any number of other shapes is also possible.

Such through holes, which may be used for forming corresponding electrical interconnects 5, can be formed using known techniques for substrate thicknesses up to 50 μm. For instance, the through holes can be formed using dry or wet etching. Further, the through holes may be formed during processing of the device substrate 1.

The thickness of the device substrate 1 is important to the process of etching through holes as etching thicker substrates may be more difficult as a strong selectivity is needed in the etching process with respect to the masking resist layer, which should not be etched away. Furthermore, the etching process for thicker device substrates would also take more processing time and be more prone to processing defects, which would result in corresponding increases in cost and decreases in yield. An additional complication for thicker substrates is that isolation of the sidewalls (e.g., by applying benzocyclobutene) and the application of metallization in the through holes may also become more difficult.

Moreover, according to the present invention, the bonded device substrate 1 undergoes processing while bonded, undergoing rather severe conditions of atmosphere, pressure and temperature. Thus, the bonding agent 4 needs to be chosen such that it does not deteriorate or otherwise interfere during processing, and such that, after processing, an efficient removal of the bonding agent 4 is possible. Preferably, the maximum temperature which can be withstood by the bonding agent 4 is higher then the maximum temperature reached by the device substrate 1 and the first carrier substrate 2 during processing.

In this example, after the device substrate 1 has been thinned to a desired thickness, processing steps are performed to form one or more electronic device in and/or on the device substrate 1. In addition to the formation of the electrical interconnects 5 (and corresponding through holes), these steps may include epitaxial deposition on the device substrate 1, wet/dry etching of the device substrate 1, diffusion of dopants into the device substrate 1 and/or deposition/annealing of other contacting layers onto the device substrate 1.

Producing Second Composite Substrate

FIG. 4 illustrates a second composite substrate. The second composite substrate shown in FIG. 4 includes the composite substrate illustrated in FIG. 3 (e.g., the processed device substrate 1 bonded to the carrier substrate 2 using the bonding agent 4) bonded with a second carrier substrate 7 using a second bonding agent 6. It will be appreciated that for this embodiment, the device substrate 1 is bonded with the carrier substrate 7 prior to being released from the carrier substrate 2.

Such an approach may be beneficial for space applications where the mass of devices (such as solar cells) produced on the device substrate 1, is desirably reduced, as was discussed above. In such approaches, the second bonding agent 6 should be a bonding agent that is conducive to use in space applications. For instance, the bonding agent 6 should be qualified (or qualifiable) in accordance with the European Space Agency (ESA) specification ESSC 12100 (Issue 2, July 2003), "Procedure for Qualifications" or to the National Aeronautics and Space Administration (NASA) specification NASA SP-8044 "Qualification Testing", or a similar standard. An example of such a material is Dow Corning's 93-500 space grade encapsulant.

The second carrier substrate 7 may be lightweight, inexpensive and/or transparent to certain light wavelengths in accordance with the particular application. For solar cell applications, the material may be selected to be transparent to sunlight, thin, strong, and generally of high quality. The carrier substrate 7 could also provide for additional functionality. In certain embodiments, the second carrier substrate 7 may be formed from high quality glass. Examples of such high quality glasses are Thales' CMG or CMX solar cell cover glasses.

The composite substrate shown in FIG. 4 may be used to produce high voltage devices, such as HVM solar cell arrays, as were discussed above. As was noted above, particularly for space applications, the problem of arcing has to be dealt with in such high voltage applications. In solar cell applications, the processed device substrate 1 can be divided into separated parts, resulting in an array of separate solar cell devices. These separate parts may then be electrically interconnected by using separation channels or through holes. This approach may be combined with embodiments where the device substrate 1 is thinned.

Using separation channels or through holes, the respective techniques of 'wrap-around' or 'wrap-through' can be used for electrical interconnection. These techniques can be performed by producing separation channels or through holes using mechanical or chemical means such as dry etching processes (e.g. RIE, ICP, plasma etching) or wet etching processes. By using such techniques, the generated current per solar cell surface area remains essentially the same, while the average voltage is multiplied by the number of solar cells in series. As an additional advantage, separation channels also allow for integrating bypass diodes.

In the composite substrate shown in FIG. 4, the second bonding agent 7 can provide mechanical stability to the device substrate 1 during changes in temperature, or can provide a degree of flexibility to the device substrate 1, thus making it less susceptible to damage due to mechanical stresses. The second carrier substrate 7, which may be termed a superstrate, forms a barrier between the devices, such as solar cells including electrical interconnections, and the surrounding environment. This barrier effectively protects the devices from the arcing phenomena described above that tend to occur in plasma-prone environments, such as those encountered in space and particularly in the vicinity of a spacecraft.

Releasing Device Substrate from First Carrier Substrate

Figure 5:
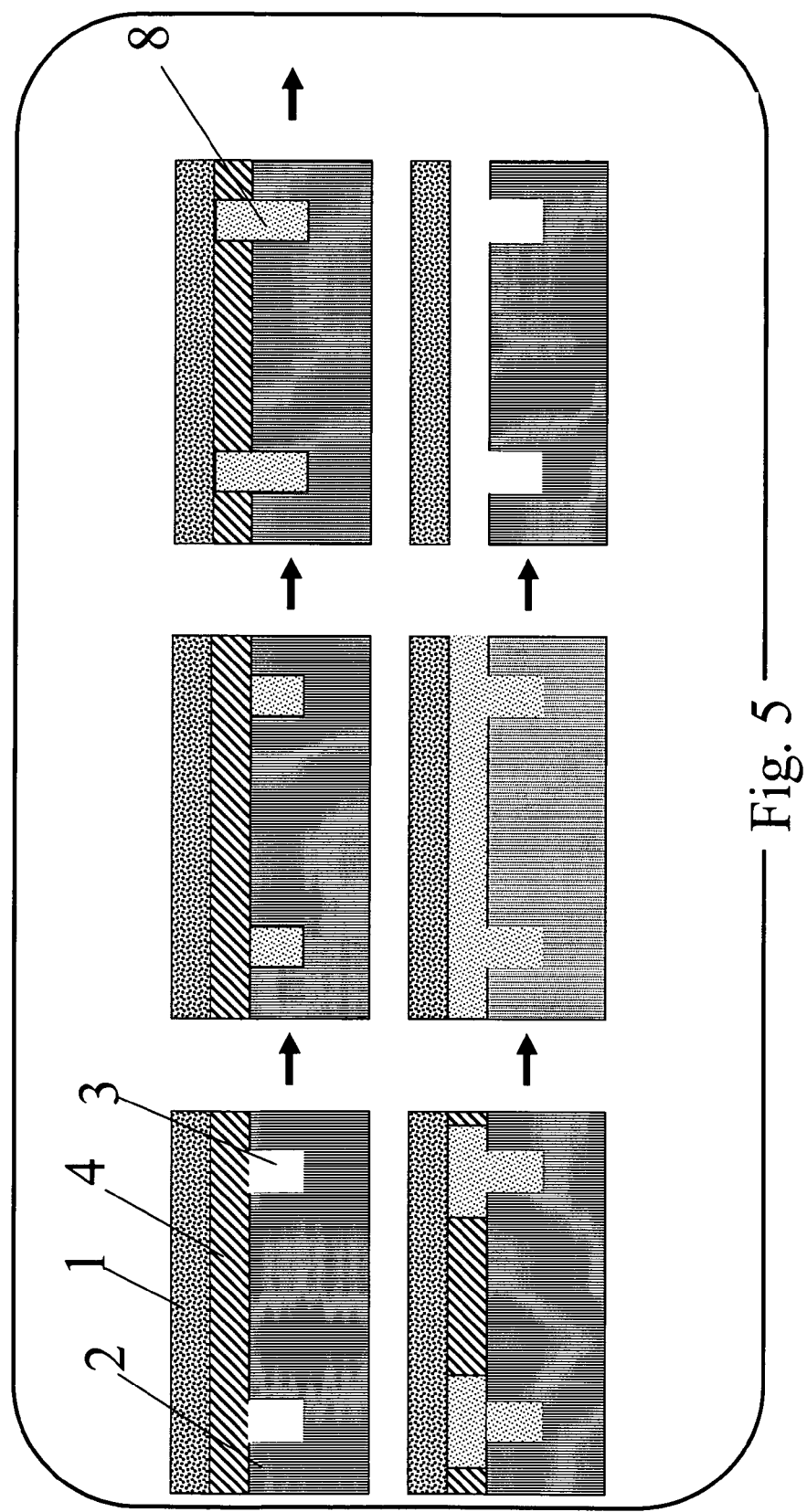
FIG. 5 is a series of cross-sectional drawings illustrating the release of a device substrate from a first carrier substrate, such as may be performed on the composite substrates of FIG. 2 or 3.

As was discussed above with respect to FIGS. 1 and 2, the trenches 3 on the first carrier substrate 2 (which should stay empty or at least partially empty after application of the first bonding agent 4 and the formation of the first composite substrate shown in FIG. 2) allow for a releasing agent 8 to reach the bonding agent 4 more readily. The releasing agent 8, as shown in FIG. 5, propagates into, and is guided by, the trenches 3 and interacts with the bonding agent 4. For instance, the releasing agent 8 etches or dissolves the bonding agent 4 or, alternatively, makes the bonding agent 4 brittle so that separation of the device substrate 1 from the carrier substrate 2 may be effected. It will be appreciated that the pattern of the trenches 3 on the carrier substrate 2 and the dimensions of the trenches 3 themselves are factors that influence the ease of release and the rate of release of the device substrate 1.

The trenches 3 may additionally allow solvents or other products used and/or produced during bonding, such as gasses which can form bubbles, to be evacuated. For example, solvents may be present in certain bonding agents when they are to be applied. In empirical studies, it has been found that the formation of bubbles in the bonding agent 4 may adversely affect the thinning step, as, in combination with mechanical pressure, the bubbles may cause cracks to appear in the bonding agent 4. These cracks may result in the device substrate 1 being destroyed. This interaction is more important for thinner device substrates and device substrates with low mechanical strength.

In an empirical example, a germanium device substrate 1 is released from the carrier substrate 2 by selectively etching the bonding agent 4, which for this example is SOG. This etching may be performed by immersing the composite substrate shown in FIG. 5 in a wet etchant (the releasing agent 8) with a strong etch selectivity of SOG with respect to germanium. The releasing agent 8 may be a diluted HF or buffered HF solution. These materials have been shown to etch SOG materials with an etch rate that is 3 to 5 orders of magnitude greater than the etch rate of germanium in these solutions. The presence of the trenches 3 in the first carrier substrate facilitates transport of the releasing agent 8 over substantially the entire area of the bonding agent 4, as is shown in FIG. 5. This spread of the releasing agent 8 results in substantially homogeneous etching over the area of the bonding agent 4 and release of the device substrate 1 from the carrier substrate 2 within 1 to 30 minutes.

As noted above, appropriate releasing agents 8 for spin-on glass bonding agent are HF or buffered HF. The releasing agent 8 may be applied in a liquid or gaseous phase. Further, the releasing agent 8 may be either pure or diluted with water.

The choice of materials for the device substrate 1, the carrier substrate 2, the bonding agent 4, the carrier substrate 7 and the bonding agent 6 should allow for the selective removal of the bonding agent 4, e.g., by etching the bonding agent 4 without significant etching of the other materials. However, if selective removal of material selected for the bonding agent 4 is not chemically feasible, additional processing steps, such as masking steps, should be included so as to adequately protect the substrates 1, 2 and 7 and the bonding agent 6, which may complicate the process.

Example Device

Figure 6:
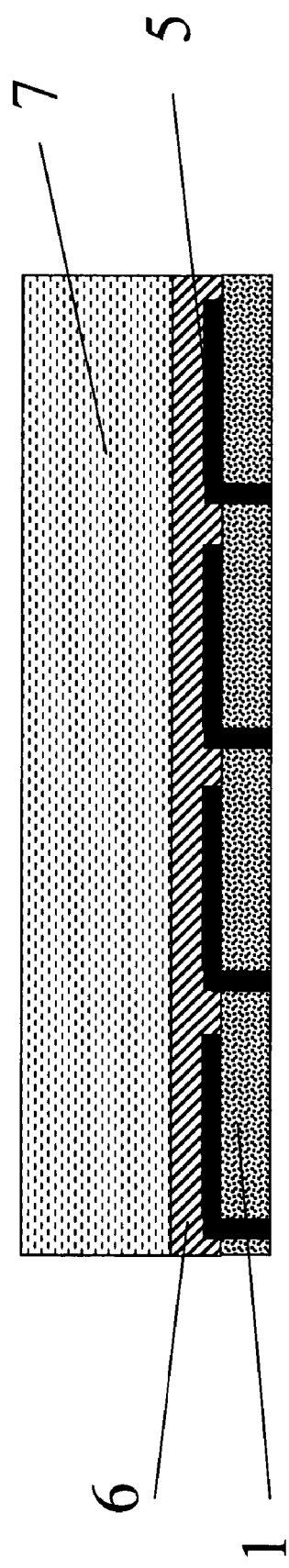
FIG. 6 is a cross-sectional drawing illustrating the device substrate and second carrier substrate of FIG. 4 after release from the first carrier substrate using a process such as illustrated in FIG. 5.

FIG. 6 is a drawing that illustrates the device substrate 1 and carrier substrate 7, which are bonded with the bonding agent 6, after release from the carrier substrate 2, such as by using a process such as the process described with respect to FIG. 5. Electronic devices are formed on (and/or in) the device substrate 1. The devices include the electrical connections 5. The electronic devices formed on the surface of (and/or in) the device substrate 1 may include solar cells, light-emitting diodes, CMOS circuits or any other device achievable by semiconductor processing, or the like. Further processing may now occur on the surface of the device substrate 1 that was previously bonded with the carrier substrate 2. Mechanical support and stability during such processing will be provided by the carrier substrate 7 in conjunction with the bonding agent 6.

Empirical Example

The following is an empirical example applying an embodiment of the methods described herein. In this example, a 500 μm thick 4 inch (10 cm) germanium carrier substrate was prepared by forming a grid-shaped matrix trench pattern on its surface. The trenches had a width of 20 μm, and an inter-trench spacing of 460 μm. This pattern, which was defined by conventional lithographic techniques, was etched using a dry etch performed using a reactive ion etching system. The depth of the trenches formed was 5 μm.

A 90 μm thick, 4 inch (10 cm) germanium device substrate was bonded to the above-described germanium carrier substrate using Filmtronics 550F SOG. The SOG was applied to a surface of the germanium device substrate by pipetting 4 ml of the SOG onto the surface. The SOG was spread over the area of the device substrate by spinning the wafer at 2000 rpm for 30 seconds. This process resulted in a substantially uniform layer of SOG with an approximate thickness of 700 nm on the surface of the device substrate.

The germanium device substrate and the carrier substrate were then positioned over each other, with the SOG coated surface of the device substrate and the trenched surface of the carrier substrate facing each other. The substrates were then mechanically pressed together. The device and carrier substrates were then placed in an oven to perform curing of the SOG. Curing of the SOG was performed in a nitrogen environment at a temperature of 425° C. for a period of 1 hour.

Using such techniques, composite substrates with a total thickness variation (TTV) of lower than 10 μm have been realized. Alternatively, bonding of 90 μm wafers with a polished surface as well as with ground and/or chemically etched surfaces could be used.

Thinning of the 90 μm germanium device substrate was performed using a combination of diamond grinding and CMP. A grinding wheel with a #1700 diamond grit was used to remove approximately 40 μm of material thickness. Subsequently, a CMP process was used to remove an additional 30 μm of material thickness in order to reach a final thickness of approximately 20 μm. The device substrate was then processed to form electronic devices.

CONCLUSION

While a number of aspects and embodiments have been discussed above, it will be appreciated that various modifications, permutations, additions and/or sub-combinations of these aspects and embodiments are possible. It is therefore intended that the following appended claims and claims hereafter introduced are interpreted to include all such modifications, permutations, additions and/or sub-combinations as are within their true spirit and scope.

What is claimed is:

1. A method for the manufacture of an electronic device comprising:
   releasably bonding a first surface of a device substrate to a surface of a first carrier substrate using a first bonding agent to produce a first composite substrate;
   while the device substrate is bonded to the first carrier substrate, processing the device substrate to manufacture an electronic device at a second surface of the device substrate; and
   releasing the device substrate from the first carrier substrate using a releasing agent, wherein the surface of the first carrier substrate comprises a pattern of trenches formed in the first surface of the first carrier substrate, and wherein the first carrier substrate is free of any through holes.

2. The method of claim 1, further comprising thinning the device substrate after releasably bonding the device substrate to the first carrier substrate and before processing the device substrate.

3. The method of claim 2, wherein the device substrate has a first thickness of at least 50 µm before thinning and a second thickness of less than 50 µm after thinning.

4. The method of claim 1, wherein releasably bonding the device substrate to the first carrier substrate to produce the first composite substrate comprises:
applying a quantity of the first bonding agent on at least one of (i) the first surface of the device substrate and (ii) the surface of the first carrier substrate, wherein the trenches are at least partially free of the bonding agent after bonding;
pressing the device substrate and the first carrier substrate against each other with the bonding agent in between to form the first composite substrate; and
applying heat to the first composite substrate.

5. The method of claim 4, wherein the first bonding agent, the device substrate and the first carrier substrate have compatible thermal expansion coefficients.

6. The method of claim 1, further comprising bonding the device substrate to a second carrier substrate using a second bonding agent to produce a second composite substrate after processing the device substrate and prior to releasing the device substrate from the first carrier substrate.

7. The method of claim 6, wherein the second bonding agent is one of a space qualified sealant and a space qualifiable sealant.

8. The method of claim 6, wherein the second carrier substrate is substantially transparent.

9. The method of claim 8, wherein the second carrier substrate comprises glass.

10. The method of claim 1, wherein processing the device substrate comprises etching at least one of through holes and trenches in the device substrate using dry etching.

11. The method of claim 1, wherein processing the device substrate comprises separating the device substrate into separated substrate parts by forming channels using at least one of mechanical processing and chemical processing.

12. The method of claim 11, wherein the separated substrate parts are electrically interconnected.

13. The method of claim 1, wherein the first bonding agent comprises spin-on glass.

14. The method of claim 13, wherein the releasing agent comprises hydrofluoric acid.

15. The method of claim 1, wherein the device substrate and the first carrier substrate are germanium substrates.

* * * * *